United States Patent [19]
Ahn et al.

[11] Patent Number: 5,614,747
[45] Date of Patent: Mar. 25, 1997

[54] METHOD FOR MANUFACTURING A FLASH EEPROM CELL

[75] Inventors: Byung J. Ahn; Jae C. An, both of Seoul; Hee Y. Lee, Daejun-Shi, all of Rep. of Korea

[73] Assignee: Hyundai Electronics Industries Co., Ltd., Kyungki-Do, Rep. of Korea

[21] Appl. No.: 508,555

[22] Filed: Jul. 28, 1995

[30]     Foreign Application Priority Data

Jul. 28, 1994  [KR]  Rep. of Korea ............. 94-18405
Jul. 28, 1994  [KR]  Rep. of Korea ............. 94-18406

[51] Int. Cl.⁶ .................... H01L 29/788; H01L 21/70
[52] U.S. Cl. .................. 257/316; 257/319; 257/321; 257/324; 257/412; 257/754; 437/40; 437/52; 437/228; 437/235; 437/233

[58] Field of Search ................... 257/316, 319, 257/321, 324, 412, 754; 437/40, 52, 228, 233, 235

[56]         References Cited

U.S. PATENT DOCUMENTS 5,284,784  2/1994  Manley .
5,338,952  8/1994  Yamauchi ..................... 257/321

*Primary Examiner*—Edward Wojciechowicz
*Attorney, Agent, or Firm*—Fish & Richardson, P.C.

[57]            ABSTRACT

The present invention discloses a split gate type flash EEPROM cell and a method of manufacturing the same which can prevent over-erasure of the flash EEPROM cell and decrease the cell area by forming a floating gate in the form of a spacer on a side wall of a select gate and by forming a control gate to surround the select gate and the floating gate.

13 Claims, 9 Drawing Sheets

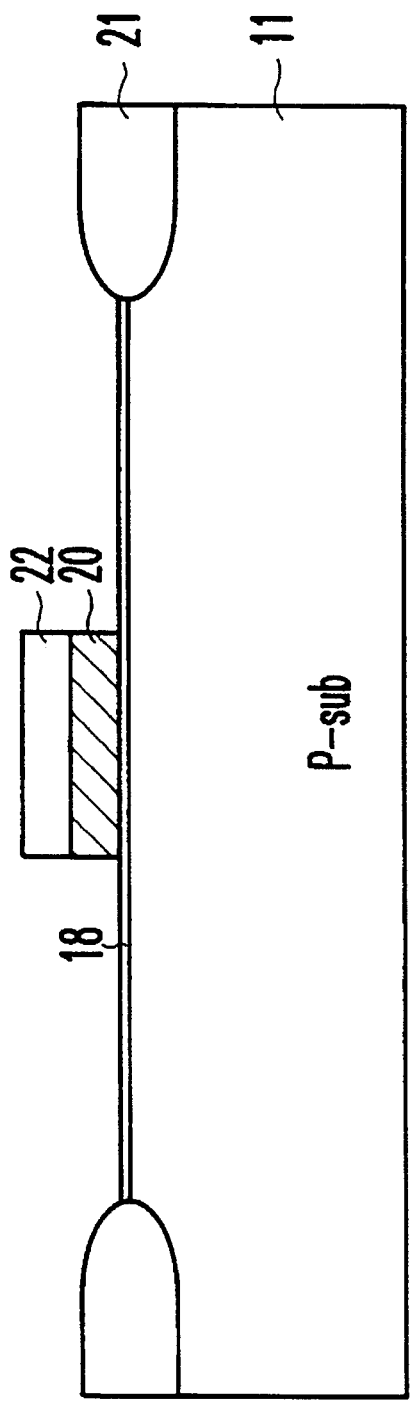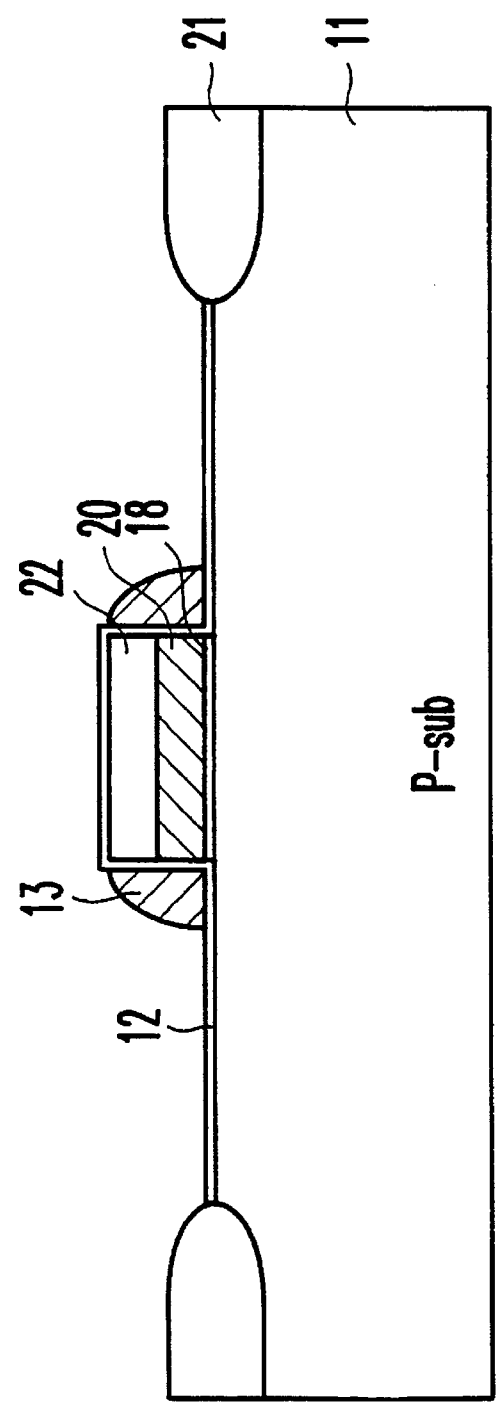

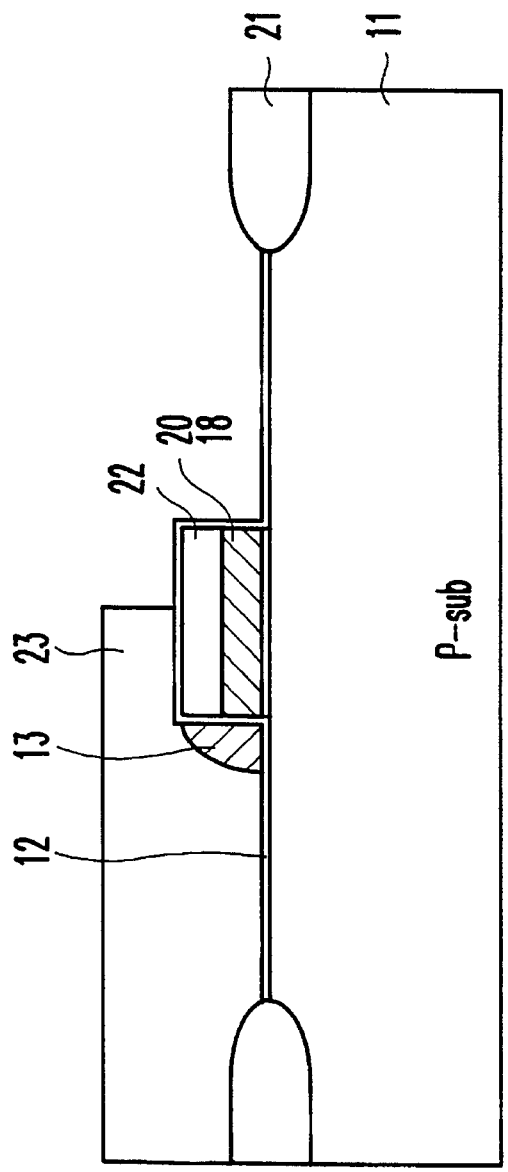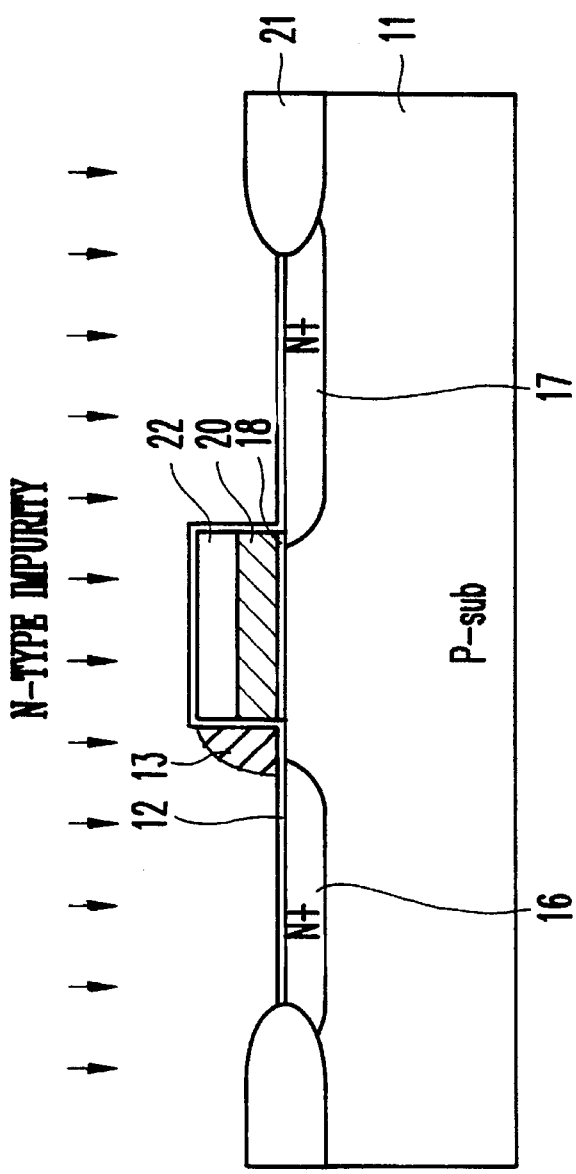

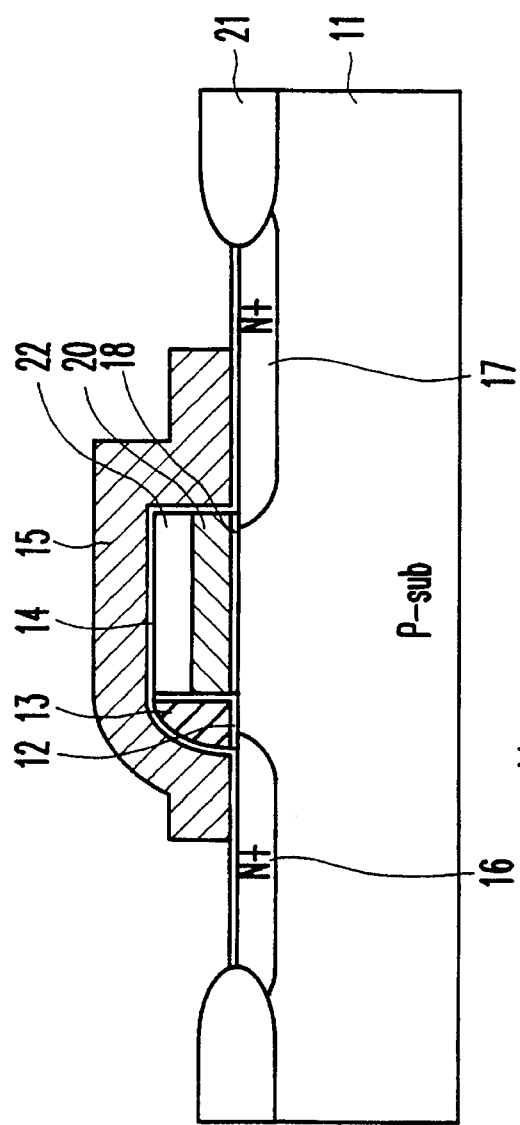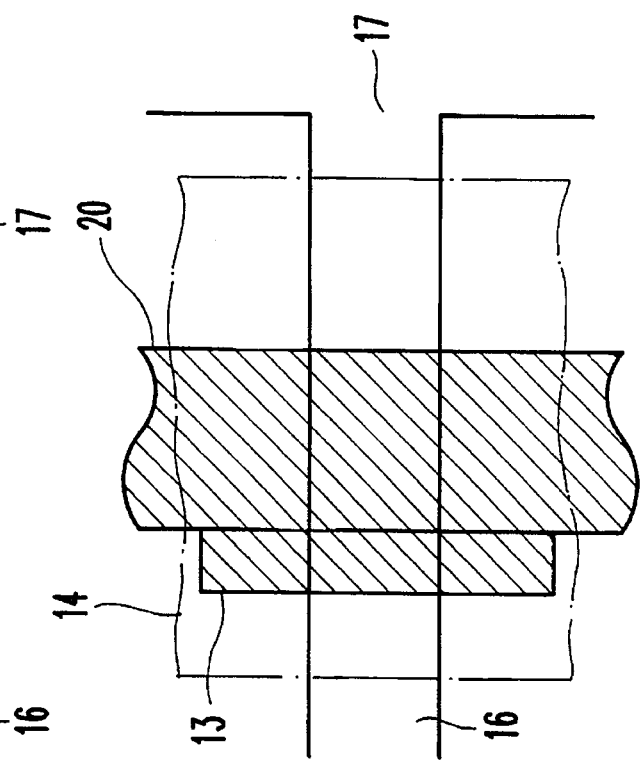
FIG. 3E
FIG. 4

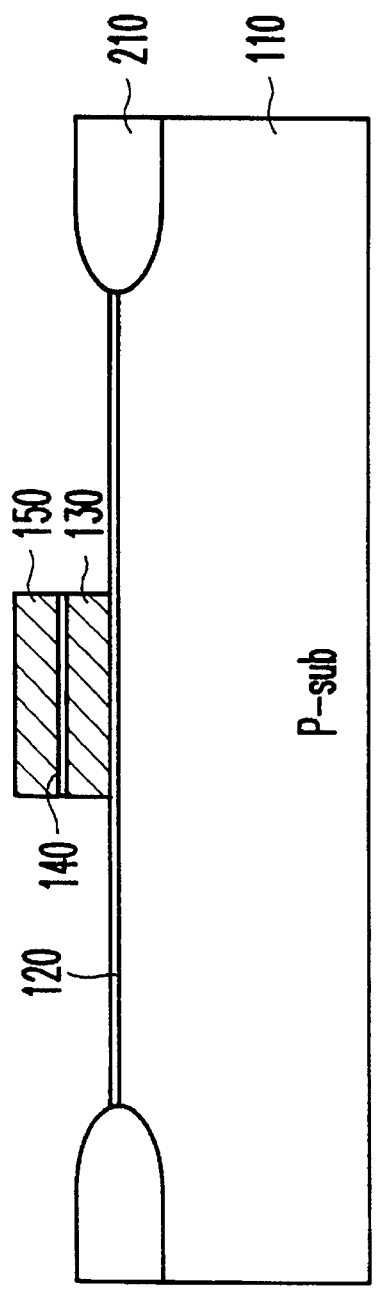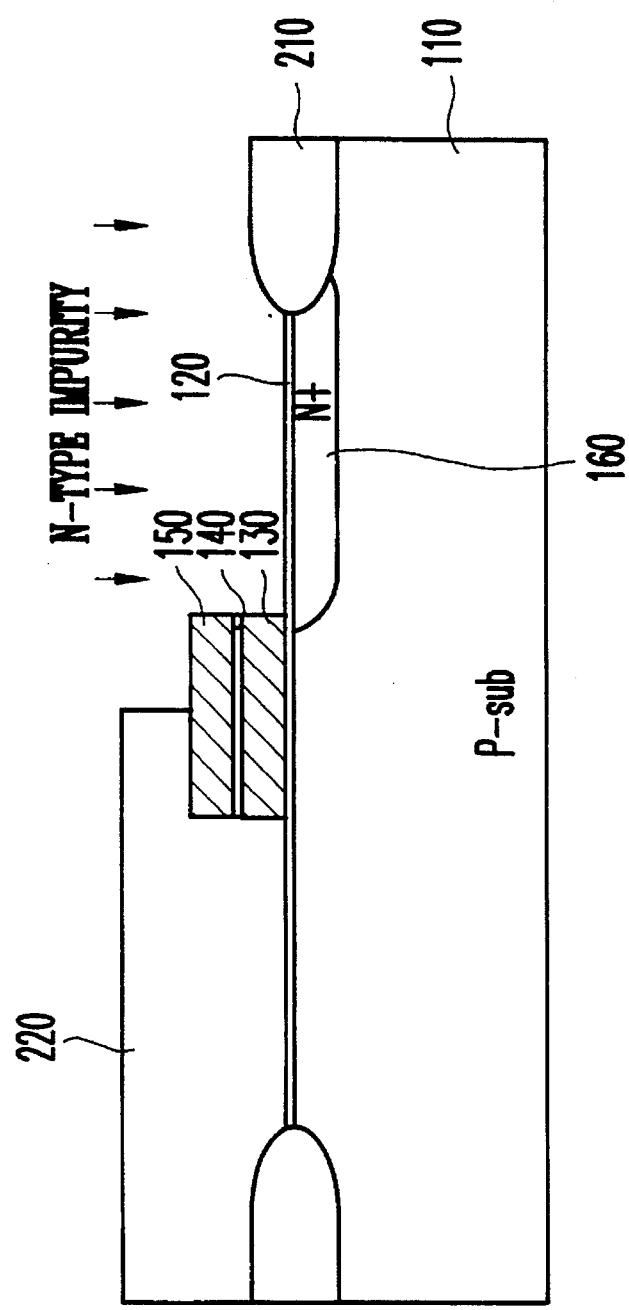

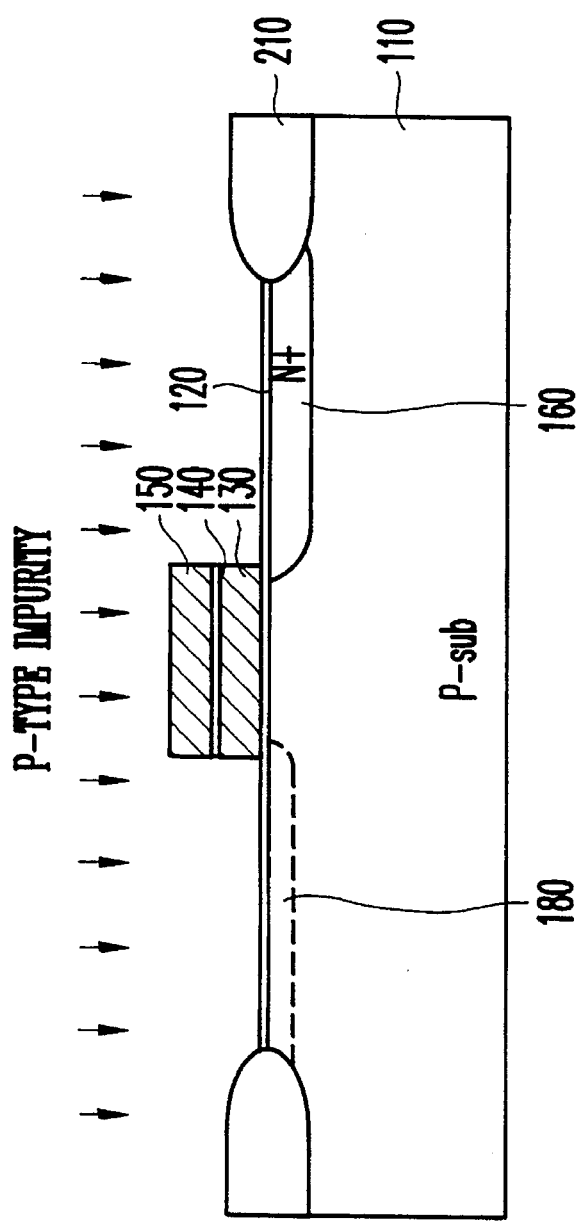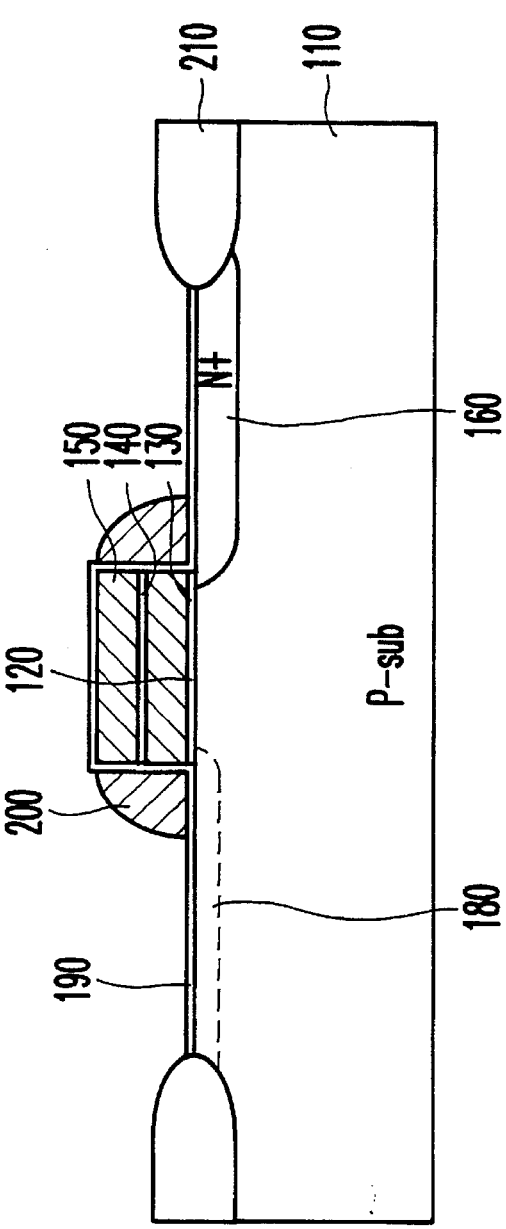

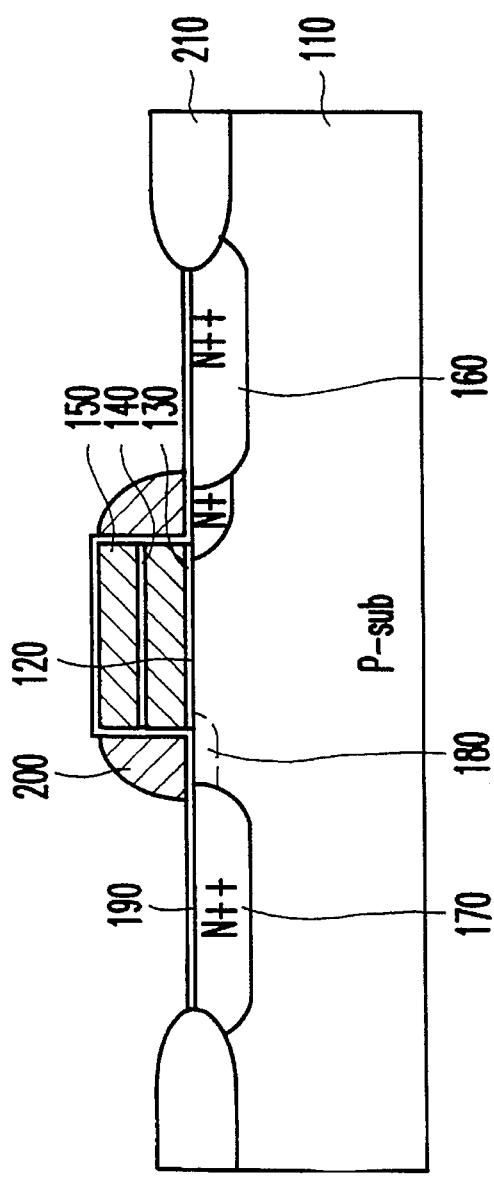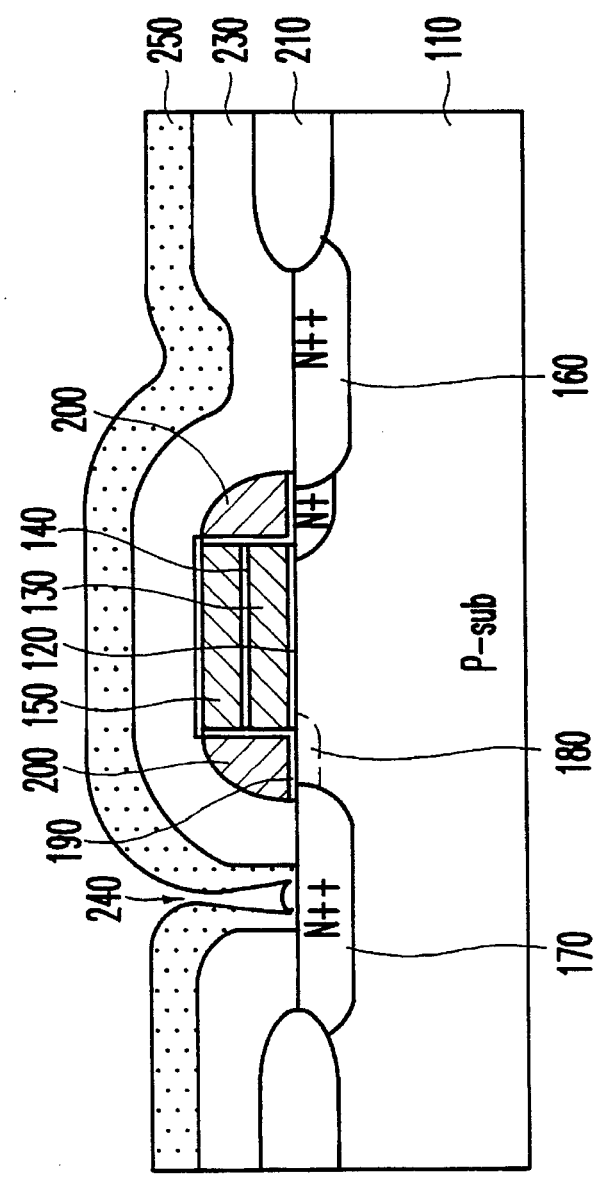

METHOD FOR MANUFACTURING A FLASH EEPROM CELL

BACKGROUND OF INVENTION

1. Field of the Invention

The present invention relates to a flash EEPROM cell and a method of manufacturing the same, and particularly, to a split gate type flash EEPROM cell and a method of manufacturing the same which not only can prevent an over-erasure of the flash EEPROM cell but also can decrease the cell area by forming a floating gate in the form of a spacer at the side wall of a select gate and by forming a control gate to surround the select gate and the floating gate.

2. Information Disclosure Statement

The flash EEPROM cell is a type of nonvolatile memory cell with the functions of electrical programming and erasing, the structure of which can mainly be classified as a stack structure or a split gate structure.

FIG. 1 shows a sectional view of a conventional flash EEPROM cell with a stack structure. FIG. 2 shows a sectional view of a conventional flash EEPROM cell with a split gate structure. A flash EEPROM cell with a stack structure or a split gate structure is basically composed of a p-type substrate 1, a tunnel oxide 2, a floating gate 3, an inter-poly oxide 4, a control gate 5, a drain region 6 and a source region 7. In particular, in the flash EEPROM cell with a split gate structure shown in FIG. 2, a select gate oxide 8 is additionally formed.

As shown in FIG. 1, the flash EEPROM cell with a stack structure has a small area such that the cell is over-erasure during the erasure operation of the cell. The split gate structure shown in FIG. 2 can solve the problem of such over-erasure. The split gate structure, however, has limitations in decreasing the cell area.

SUMMARY OF THE INVENTION

Therefore, the object of the present invention is to provide a split gate type flash EEPROM cell and a method of manufacturing the same which not only can prevent the over-erasure of the flash EEPROM cell but also can decrease the cell area by forming a floating gate in the form of a spacer at the side wall of a select gate and by forming a control gate to surround the select gate and the floating gate.

To achieve the object, a flash EEPROM cell according to a first embodiment of the present invention comprising:

a select gate oxide, a select gate and a dielectric oxide formed in stacks on an selected region of a p-type substrate; a tunnel oxide formed on one side wall of the select gate oxide, select gate and dielectric oxide and on a selected region of the p-type substrate extended below from the side wall; a floating gate formed on the tunnel oxide; a drain region and a source region formed on the p-type substrate; an inter-poly oxide formed on entire structure after formation of the tunnel oxide; and a control gate formed on the inter-poly oxide.

A flash EEPROM cell according to a second embodiment of the present invention comprising:

a tunnel oxide, a floating gate, an inter poly oxide and a control gate formed in stacks on a selected region of a p-type substrate; a select gate oxide formed on entire structure after formation of the control gate; select gates formed on the select gate oxide formed on both side walls of the floating gate and control gate; and a source region and a drain region formed on the p-type substrate.

A method of manufacturing a flash EEPROM cell according to a first embodiment of the present invention, comprising the steps of:

growing a select gate oxide on a p-type substrate, and sequentially forming a select gate and a dielectric oxide on selected regions of the select gate oxide; growing a tunnel oxide after removing exposed portion of the select gate oxide, and thereafter, forming a floating gate on the tunnel oxide formed on both side walls of the select gate and dielectric oxide; removing either one of the floating gates; forming a drain region and a source region on the p-type substrate by n-type high concentration ion implantation process; and forming an inter-poly oxide on the entire structure after formation of the drain and source regions, and thereafter, forming a control gate on the inter-poly oxide.

A method of manufacturing a flash EEPROM cell according to a second embodiment of the present invention, comprising the steps of:

growing a tunnel oxide on a p-type substrate, and sequentially forming a floating gate, an inter-poly oxide and a control gate on a selected region on the tunnel oxide; forming a drain region by n-type high concentration ion implantation process in a selected region of the p-type substrate; forming a select gate channel region by p-type ion implantation process on the p-type substrate; growing a select gate oxide on the entire structure after p-type ion implantation process, and thereafter, forming a select gate on the tunnel oxide formed on both side walls of the floating gate and control gate; and forming a source region by high concentration n-type ion implantation process.

BRIEF DESCRIPTION OF THE DRAWINGS

To better understand the nature and objective of the invention, reference should be made to the following detailed descriptions of the accompanying drawings in which:

FIGS. 3A through 3E are sectional views showing the steps for manufacturing a flash EEPROM cell according to the first embodiment of the present invention;

FIG. 4 is a layout of the flash EEPROM cell shown in FIG. 3E;

FIGS. 6A through 6F are sectional views showing the steps for manufacturing a flash EEPROM cell according to the second embodiment of the present invention.

Similar reference characters refer to similar parts through the several views of the drawings.

DETAILED DESCRIPTION OF THE INVENTION

Figure 1:
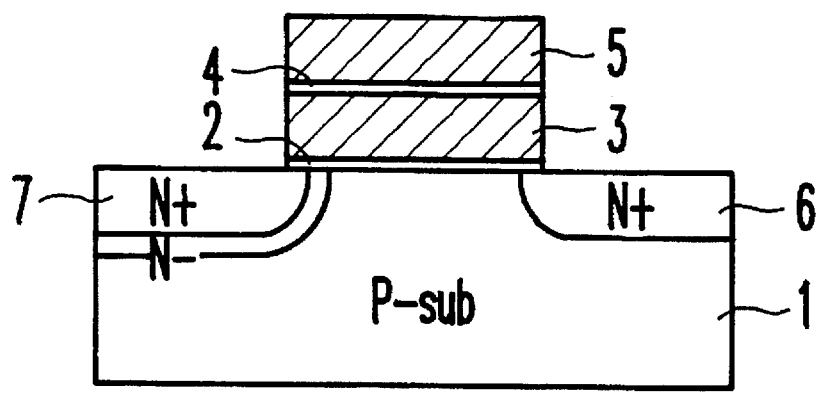
FIG. 1 is a sectional view of a conventional flash EEPROM cell with a stack structure.
Figure 2:
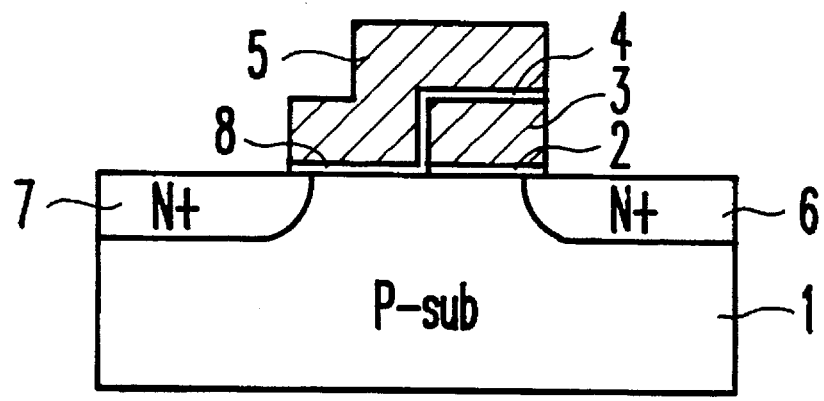
FIG. 2 is a sectional view of a conventional flash EEPROM cell with a split gate structure.

FIG. 1 is a sectional view of a conventional flash EEPROM cell with a stack structure and FIG. 2 is a sectional view of a conventional flash EEPROM cell with a split gate structure. FIG. 1 and FIG. 2 are described above.

FIGS. 3A through 3E are sectional views showing the steps for manufacturing a flash EEPROM cell according to the first embodiment of the present invention.

FIG. 3A shows a formation in which a select gate oxide 18 is grown after an active region is defined by forming a field oxide 21 in the p-type substrate 11, and a select gate 20 and a dielectric oxide 22 are sequentially formed in stacks on the select gate oxide 18 by a lithography process.

The select gate 20 and dielectric oxide 22 is formed by a lithography process using a select gate mask after a polysilicon and an oxide are sequentially formed on the select gate oxide 18. The dielectric oxide 22 is formed relatively thickly to insulate between the select gate 20 and a control gate to be formed during a later process.

FIG. 3B shows a formation in which an exposed portion of the select gate oxide 18 is removed; a thin tunnel oxide 12 is grown with the thickness of about 100 Å on the entire structure except the field oxide 21; a polysilicon is deposited on the tunnel oxide 12; and two floating gates 13 are formed in the form of a polysilicon spacer on the tunnel oxide 12 formed on both side walls of the select gate 20 and the dielectric oxide 22 by etching the polysilicon by an anisotropic etching process.

Referring to FIG. 3C, a photoresist pattern 23 is formed on the entire structure and, thereafter, any one of the two floating gates 13 is removed by an isotropic polysilicon etching process. It is desirable to form the floating gate 13 on the side of a drain region.

FIG. 3D shows a formation where the photoresist pattern 23 is removed and a drain region 16 and source region 17 are formed by a high concentration n-type ion implantation process.

FIG. 3E shows a formation where an inter-poly oxide 14 is formed on the entire structure. Thereafter, a polysilicon is deposited on the inter-poly oxide 14 and a control gate 15 is formed by a lithography process.

Thereafter, the split gate type flash EEPROM cell of the present invention is completed by a device protection film and metal wire forming process which are not shown in the drawings.

FIG. 4 is a layout showing a plan view of FIG. 3E.

In the flash EEPROM cell of the present invention, a select gate oxide 18, a select gate 20 and a dielectric oxide 22 are formed on the p-type substrate 11 in stacks as shown in FIG. 3E. A floating gate 13 electrically insulated from the substrate 11 and the select gate 20 by the tunnel oxide 12 are formed on one side wall of the select gate 20 and dielectric oxide 22. The drain region 16 is formed in the exposed substrate 11 on the side. of the floating gate 13, and the source region 17 is formed in the exposed substrate 11 on the opposite side of the floating gate 13. A control gate 15 is formedon the tunnel oxide 12 in such a way that a portion of the tunnel oxide 12 on the drain region 16 and the source region 17 is exposed.

An explanation of the electrical operation of the flash EEPROM cell according to the first embodiment of the present invention constructed as described above is given below with reference to FIGS. 5A and 5B.

Figure 5A:
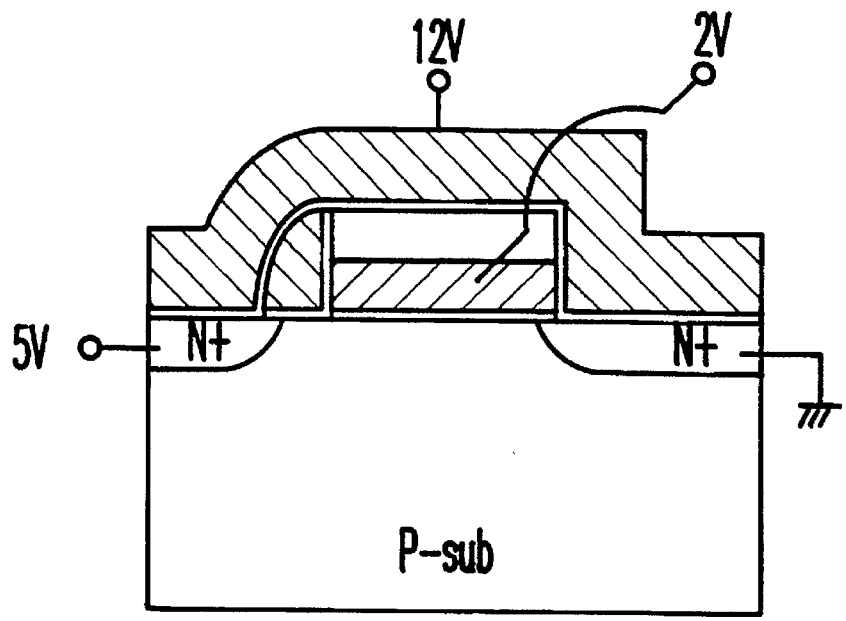
FIGS. 5A and 5B are sectional views illustrating the electrical operation of the flash EEPROM cell according to the first embodiment of the present invention.

FIG. 5A is a sectional view illustrating an electron movement at the time of programming. A voltage of about 5 V is applied to the cell drain 16 and a high voltage of 12 V is applied to the control gate 15. At this time, if a low voltage of about 2 V is applied to the select gate 20, an electric field is formed at a portion where the floating gate 13 and the select gate channel meet together, and channel hot electrons are generated. The electrons are stored in the floating gate 13 so that the programming is completed.

Figure 5B:
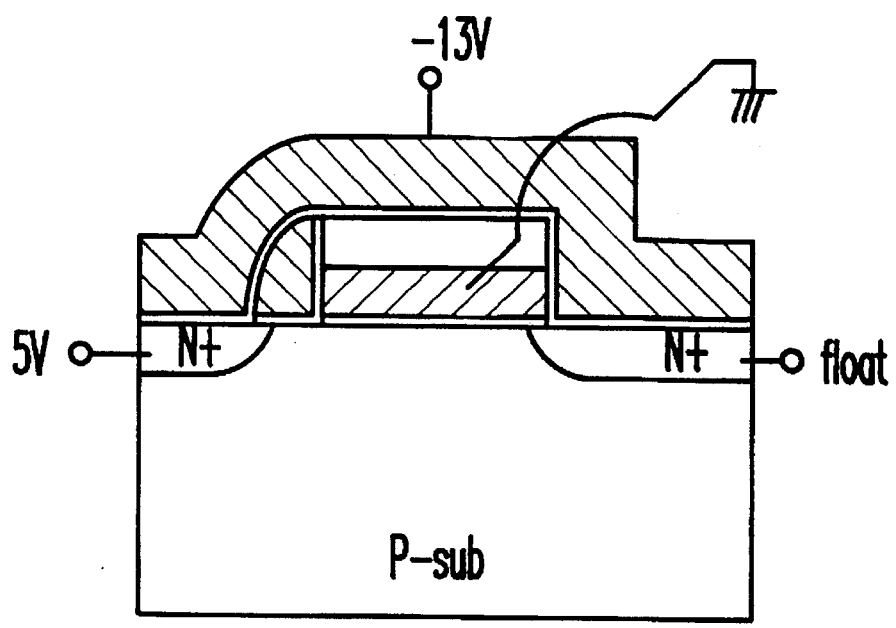

FIG. 5B is a sectional view illustrating an electron movement at the time of erasure. The source 17 is floated and the select gate 20 grounded. Under such conditions, if a voltage of about —13 V is applied to the control gate 15 and a voltage of about 5 V is applied to the drain 16, then F-N tunneling(Folwer-Nordhein Tunneling) is generated by an electric field in the tunnel oxide 12, whereby the electrons stored in the floating gate 13 are pulled out to the drain 16 to erase information.

FIGS. 6A through 6F are sectional views showing the steps for manufacturing the flash EEPROM cell according to the second embodiment of the present invention.

FIG. 6A shows a formation where a thin tunnel oxide 120 is formed with a thickness of about 100 Å after an active region is defined by forming a field oxide 210 on a p-type substrate 110, and a floating gate 130, inter-poly oxide 140 and control gate 150 are formed in stacks on the tunnel oxide 120 by a lithography process.

FIG. 6B shows a formation where a photoresist pattern 220 is formed by a mask and etching process to define a drain region after coating a photoresist on the entire structure, and a drain region 160 is formed by a high concentration n-type ion implantation process.

FIG. 6C shows a formation where the photoresist pattern 220 is removed and, thereafter, a select gate channel region 180 is formed at the side of the source region by a low concentration p-type ion implantation process to control the threshold voltage of a select gate channel and to improve the program characteristics. At this time, since the drain region 160 is formed with n-type high concentration ions, although p-type ions are also implanted into the drain region 160, the low concentration p-type ions are not able to affect the drain region 160.

FIG. 6D shows a formation where an exposed portion of the tunnel oxide 120 is removed. Thereafter, a select gate oxide 190 is grown on the entire structure except the field oxide 210; a polysilicon is deposited on said select gate oxide 190; and thereafter, a select gate 200 is formed in the form of a polysilicon spacer on the select gate oxide formed on both side walls of the floating gate 130 and control gate 150 by etching the polysilicon using an anisotropic etching process.

FIG. 6E shows a formation where a source region 170 is formed by a high concentration n-type ion implantation process.

FIG. 6F shows a formation where a source contact 240 process is begun after a device protection film 230 is deposited on the entire structure, and the split gate type flash EEPROM cell of the present invention is completed by forming a metal wire 250.

In the flash EEPROM cell of the second embodiment of the present invention, a tunnel oxide 120, floating gate 130, inter-poly oxide 140 and control gate 150 are formed on the p-type substrate 110 in stacks as shown in FIG. 6F. A select gate 200 which is electrically insulated from the substrate 110, floating gate 130, inter-poly oxide 140 and control gate 150 by the select gate oxide 190 is formed on both side walls of the floating gate 130 and control gate 150. The select gate channel region 180 to which p-type ions are implanted is formed at the side of the source region 170 to control the threshold voltage of the select gate channel and to improve the program characteristics of the cell, and a drain region 160 is formed opposite to the source region 170.

An explanation of the electrical operation of the flash EEPROM cell according to the second embodiment of the present invention constructed as described above is given below with reference to FIGS. 7A and 7B.

Figure 7A:
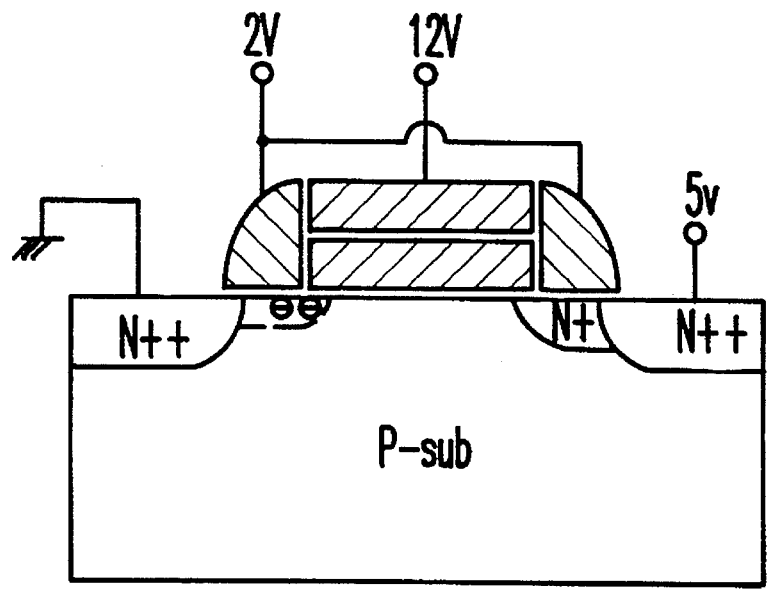
FIGS. 7A and 7B are sectional views illustrating the electrical operation of the flash EEPROM cell according to the second embodiment of the present invention.

FIG. 7A is a sectional view illustrating the electron movement during programming. A voltage of about 5 V is applied to the drain region 160 and a high voltage of 12 V is applied to the control gate 150. At this time, if a low voltage of about 2 V is applied to the select gate 200, an electric field is formed at a portion where the floating gate 130 and the select gate channel region 180 meet, and channel-hot electrons are generated. The electrons are stored in the floating gate 13 so that the programming is completed.

Figure 7B:
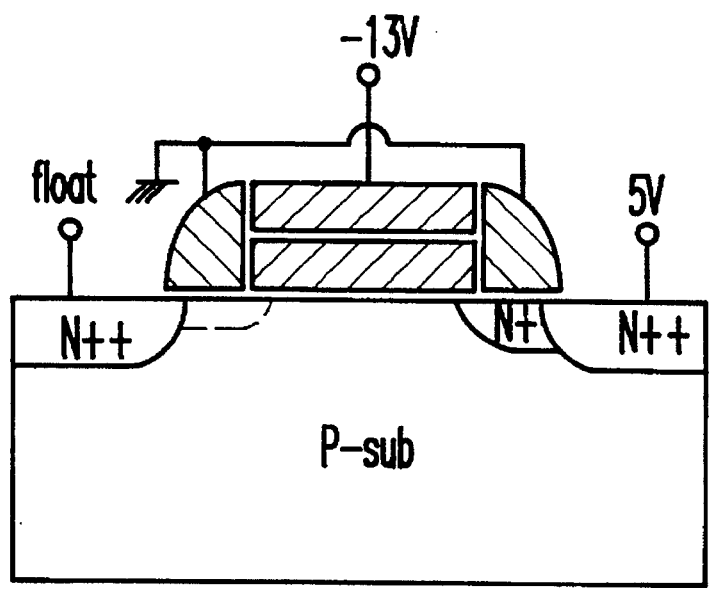

FIG. 7B is a sectional view illustrating the electron movement during erasure. The source region 170 is floated and the select gate 200 is grounded. Under such conditions, if a voltage of about —13 V is applied to the control gate 150 and a voltage of about 5 V is applied to the drain 160, then F-N tunneling is generated by an electric field in the tunnel oxide, whereby the electrons stored in the floating gate 130 are pulled out to the drain 160 to erase information.

As described above, the present invention solves the problem of over-erasure of the cell and achieves high integration.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A flash EEPROM cell comprising:
   a select gate oxide, a select gate and a dielectric oxide formed in stacks on a selected region of a p-type substrate;
   a tunnel oxide layer formed on one side wall of said select gate oxide, select gate and dielectric oxide and on a selected region of said p-type substrate extended below from said side wall;
   a floating gate formed on said tunnel oxide;
   a drain region and a source region formed on said p-type substrate;
   an inter-poly oxide formed on the entire structure after the formation of said tunnel oxide; and
   a control gate formed on said inter-poly oxide.

2. The flash EEPROM cell of claim 1, wherein said tunnel oxide is formed with a thickness of about 100 Å.

3. The flash EEPROM cell of claim 1, wherein said floating gate is formed with a polysilicon and in the form of a spacer.

4. A method of manufacturing a flash EEPROM cell comprising, the steps of:
   growing a select gate oxide on a p-type substrate, and sequentially forming a select gate and a dielectric oxide on selected regions of said select gate oxide;
   growing a tunnel oxide after removing exposed portion of said select gate oxide, and thereafter, forming a floating gate on said tunnel oxide formed on both side walls of said select gate and dielectric oxide;
   removing either one of said floating gates;
   forming a drain region and a source region on said p-type substrate by n-type high concentration ion implantation process; and
   forming an inter-poly oxide on the entire structure after formation of said drain and source regions and, thereafter, forming a control gate on said inter-poly oxide.

5. The method of claim 4, wherein said tunnel oxide is formed with a thickness of about 100 Å.

6. The method of claim 4, wherein said floating gate is formed with polysilicon and in the form of a spacer.

7. A flash EEPROM cell comprising:
   a tunnel oxide, a floating gate, an inter-poly oxide and a control gate formed in stacks on a selected region of a p-type substrate;
   a select gate oxide formed on entire structure after formation of said control gate;
   select gates formed on said select gate oxide formed on both side walls of said floating gate and control gate; and
   a source region and a drain region formed on said p-type substrate.

8. The flash EEPROM cell of claim 7 further comprising a select gate channel region formed in a selected region of said p-type substrate below said select gate.

9. The flash EEPROM cell of claim 7, wherein said tunnel oxide is formed with a thickness of 100 Å.

10. The flash EEPROM cell of claim 7, wherein said select gate is formed with a polysilicon and in the form of a spacer.

11. A method of manufacturing a flash EEPROM cell comprising the steps of:
    growing a tunnel oxide on a p-type substrate, and sequentially forming a floating gate, an inter-poly oxide and a control gate on a selected region on said tunnel oxide;
    forming a drain region by n-type high concentration ion implantation process in a selected region of said p-type substrate;
    forming a select gate channel region by p-type ion implantation process on said p-type substrate;
    growing a select gate oxide layer on the entire structure after p-type ion implantation process is advanced and, thereafter, forming a select gate on said tunnel oxide formed on both side walls of said floating gate and control gate; and
    forming a source region by high concentration n-type ion implantation process.

12. The method of claim 11, wherein said tunnel oxide layer is formed with a thickness of about 100 Å.

13. The method of claim 11, wherein said select gate is formed with polysilicon and in the form of a spacer.

* * * * *